(12) United States Patent
Salgueiro

(10) Patent No.: US 8,675,886 B2
(45) Date of Patent: Mar. 18, 2014

(54) METHOD AND APPARATUS FOR PROVIDING A SPLITTER IN A NOTIFICATION SYSTEM

(75) Inventor: David J. Salgueiro, Cranford, NJ (US)

(73) Assignee: Wheelock, Inc., Long Branch, NJ (US)

( * ) Notice: Subject to any disclaimer, the term of this patent is extended or adjusted under 35 U.S.C. 154(b) by 1264 days.

(21) Appl. No.: 10/967,402

(22) Filed: Oct. 18, 2004

(65) Prior Publication Data
US 2005/0163306 A1  Jul. 28, 2005

Related U.S. Application Data

(60) Provisional application No. 60/512,505, filed on Oct. 17, 2003.

(51) Int. Cl.
*H04B 3/00*  (2006.01)

(52) U.S. Cl.
USPC ............... 381/77; 381/81; 381/85; 381/123; 340/506; 340/291

(58) Field of Classification Search
USPC ............ 381/85, 80, 81, 77, 82, 84, 123, 120; 340/508, 506, 501, 500, 291; 379/322
See application file for complete search history.

(56) References Cited

U.S. PATENT DOCUMENTS

| | | | | |
|---|---|---|---|---|
| 4,507,652 A | * | 3/1985 | Vogt et al. | 340/501 |
| 4,916,432 A | * | 4/1990 | Tice et al. | 340/518 |
| 5,701,115 A | * | 12/1997 | Right et al. | 340/286.05 |
| 6,826,027 B2 | * | 11/2004 | Galgay | 361/58 |

OTHER PUBLICATIONS

Edwards Company, Inc. "Edwards Booster Power Supply Manual", Revision 1.0, Feb. 2000.*
Merriam-Webster's Collegiate Dictionary, Tenth Edition, 2001, pp. 207 and 610.*

* cited by examiner

*Primary Examiner* — Vivian Chin
*Assistant Examiner* — Con P Tran

(57) ABSTRACT

The present invention relates to an apparatus and concomitant method for providing a splitter in a notification system. More specifically, the present invention provides a splitter, e.g., between an audio power booster and at least one notification appliance in a supervised emergency voice evacuation system.

22 Claims, 9 Drawing Sheets

METHOD AND APPARATUS FOR PROVIDING A SPLITTER IN A NOTIFICATION SYSTEM

This application claims the benefit of U.S. Provisional Application No. 60/512,505 filed on Oct. 17, 2003, which is herein incorporated by reference.

The present invention relates to an apparatus and concomitant method for providing a splitter in a notification system. More specifically, the present invention provides a splitter, e.g., between an audio power booster and at least one notification appliance in a supervised emergency voice evacuation system.

BACKGROUND OF THE DISCLOSURE

An emergency notification system for a facility is often designed to drive a certain number of notification appliances, e.g., audio notification appliances, visual notification appliances and both audio and visual notification appliances. In operation, an amplifier is often deployed within a centralized panel, e.g., a fire voice evacuation panel, to achieve this capability.

However, if the facility is expanded such that additional notification appliances are added to the overall emergency notification system, the amplifier may not be capable of performing its functions in a reliable manner. Often it is necessary to modify or upgrade the panel if the added notification appliances exceed the capability of the amplifier. This is a costly modification and may require an extensive period of time where the emergency notification system is inactivated to allow the modification to be made, which is undesirable for safety reasons.

Thus, there is a need for an apparatus and concomitant method for boosting a signal, e.g., an audible signal and/or a power signal, in a notification system. Such a booster is disclosed in U.S. patent application Ser. No. 10/323,875 filed on Dec. 19, 2002, and herein incorporated by reference.

However, there is a need for an apparatus and concomitant method for providing a splitter that is capable of interacting, e.g., with a booster to support a plurality of loops of notification appliances in a notification system.

SUMMARY OF THE INVENTION

The present invention relates to an apparatus and concomitant method for providing a splitter in a notification system. More specifically, the present invention provides a splitter, e.g., between a panel and/or an audio power booster and at least one notification appliance in a supervised emergency voice evacuation system. Specifically, the present splitter provides splitting function for two classes of wiring: Class A and Class B. Additionally, the splitter is designed to respond to a potential fault condition in greater speed than an amplifier, e.g., that is situated within the audio booster. In this fashion, the splitter may determine and address a temporary fault condition in a timely manner, without having the amplifier being shut down.

Thus, the present "CLASS A/B" splitter can be used for full time supervision in either CLASS A wiring or in CLASS B wiring. In one embodiment, supervision is achieved by reading the "End Of Line" voltage across an "End of Line" (EOL) resistor and reacting appropriately to it when it goes outside of the normal operating range.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

In one embodiment, the present invention is a splitter, e.g., a Class A/B splitter that is issued to convert one supervised audio output into a plurality of supervised sub zones which support Class B wiring or Class A wiring. To illustrate in one exemplary embodiment, the Class A/B splitter's purpose is to split one supervised audio output from an Emergency Voice Evacuation System or a supervised audio power booster. It should be noted that Class A and Class B wiring is defined in accordance with the National Fire Protection Association (NFPA) 72 as Style Z wiring and Style Y wiring, respectively. It should be noted that these wiring classes may be known under different names and the present invention is not limited by these naming conventions.

For example, the splitter of the present invention can split one 40 Watt (Max) supervised audio output from a Multi-Function Supervised Paging, Messaging, Background Music and Emergency Voice Evacuation System or a control panel (e.g., the SP-40/2 from Wheelock of Long Branch, N.J.), or one 80 Watt (Max) supervised audio output from a supervised audio power booster (e.g., the SPB-160 or the SPB-80/4 also from Wheelock), into multiple supervised audio outputs. The present disclosure uses the numerical references SP-40/2, SPB-160 and the SPB-80/4 only as examples to broadly referred to devices, e.g., emergency voice evacuation systems or control panels and audio power boosters, and the like, that are capable of producing a supervised audio output that is in turn split by the present splitter. As such, uses of these numerical references are not intended to limit the present invention. In fact, any other devices that produce supervised audio output that can be adapted to use the present splitter are contemplated. Additionally, the term "supervised" audio signal is intended to mean broadly that a communication line on which the audio signal is traversing is being monitored, e,g., is the line normal, short or open and so on.

In one embodiment, the splitter allows for up to 20 Watts (Max) on each of the four output zones when in Class B mode or for up to 40 Watts (Max) on each of the two output zones when in Class A mode. The Class A/B splitter can drive this wattage at either 25 or 70 Volts of audio. The present invention provides manufacturing efficiency since only splitter need to be manufactured to support two wiring classes. In one embodiment, the splitter of the present invention can be set for either Class A or Class B wiring via four jumpers 105.

Figure 1:
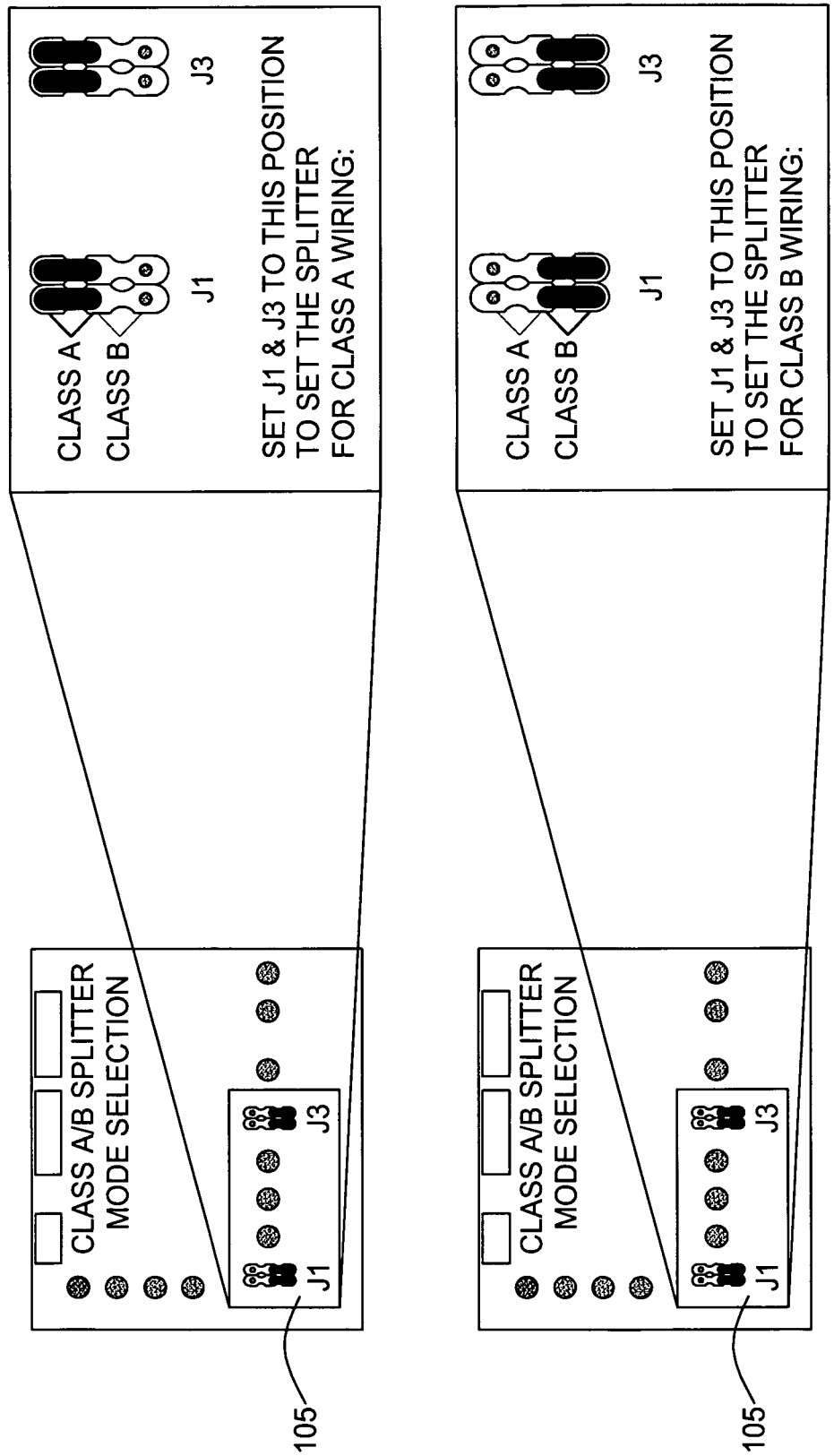
FIG. 1 illustrates a Class A/B splitter wiring mode selection of the present invention.

FIG. 1 illustrates Class A/B splitter wiring mode selection. Namely, to switch between Class A and Class B wiring, the user simply moves all four jumpers from one position to the other. It should be noted that the present invention is not limited by the number of jumpers that are used to switch between the two modes of operation.

Figure 2:
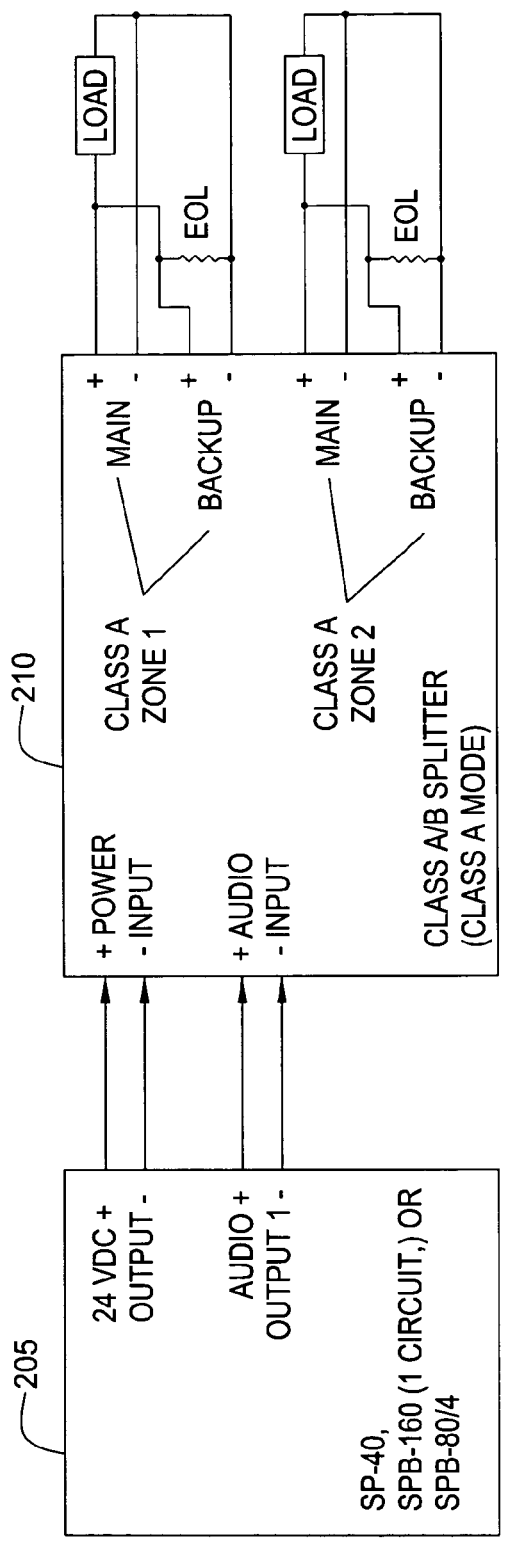
FIG. 2 illustrates a splitter operating in Class A mode of the present invention.
Figure 4:
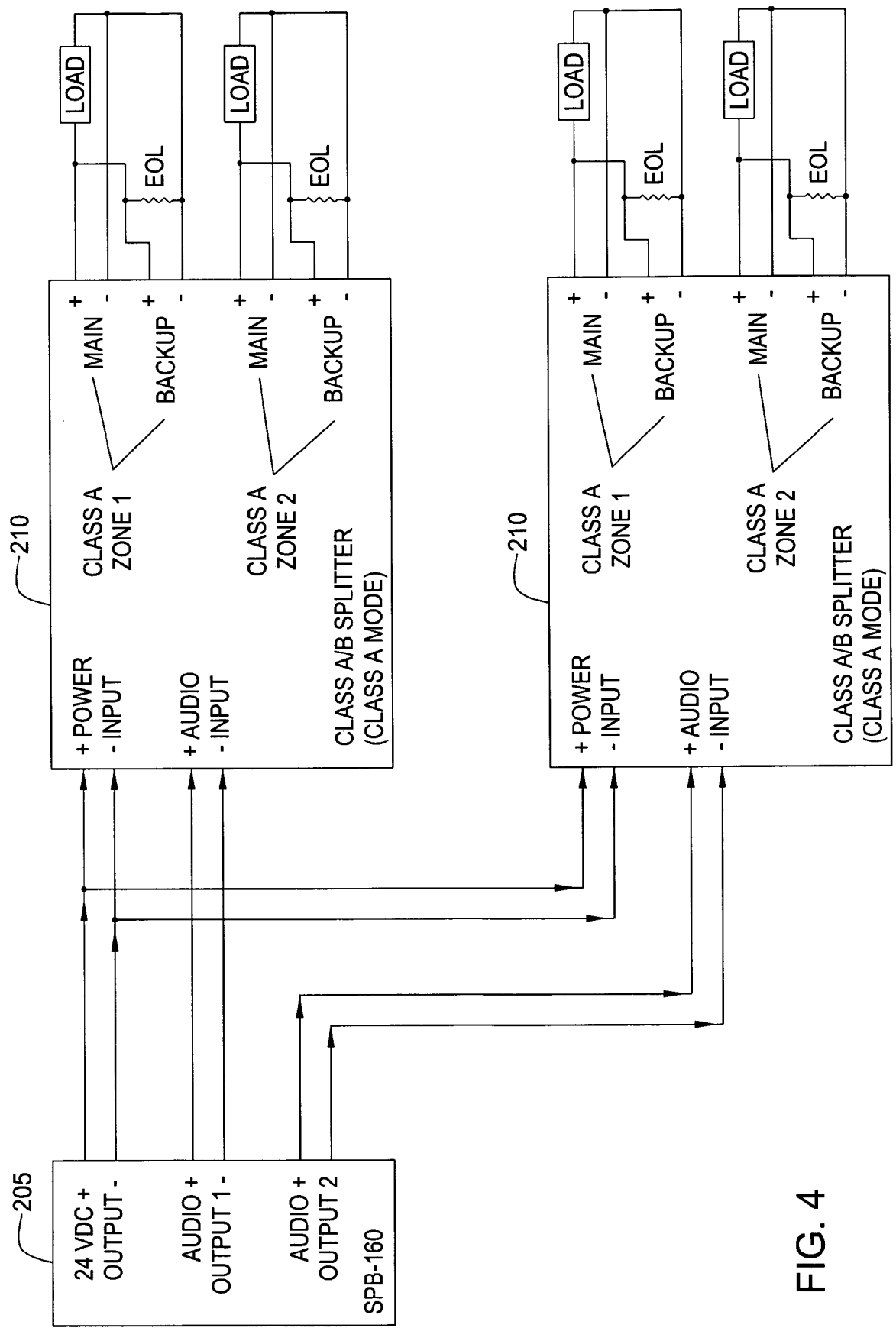
FIG. 4 illustrates a wiring diagram for connecting two splitters of the present invention for Class A mode.

FIG. 2 illustrates a splitter 210 operating in Class A mode of the present invention. When Class A mode is selected, the splitter 210 only supports Class A wiring. In one embodiment, the SP-40/2 and SPB-80/4 (205) can support up to one Class A/B Splitter, while the SPB-160 (205) can support up to two Class A/B Splitters. While in Class A mode, the splitter 210 in one embodiment allows for a maximum of two supervised audio output zones. FIG. 4 also illustrates a pair of splitters 210 operating in Class A mode.

Figure 3:
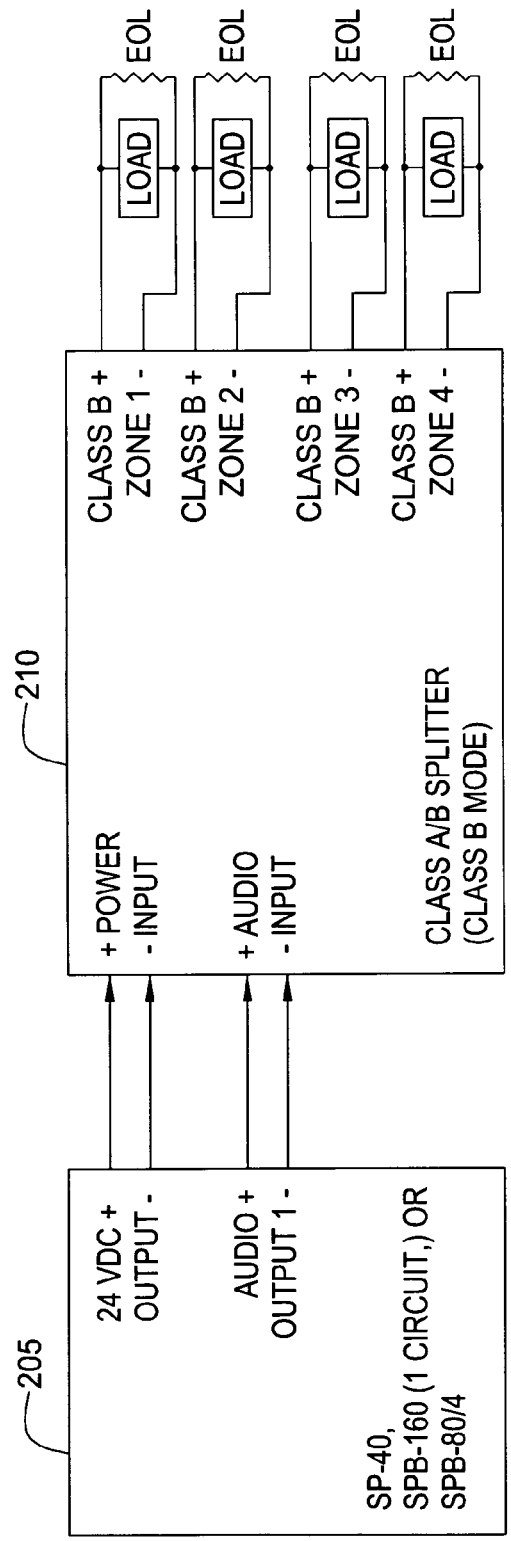
FIG. 3 illustrates a splitter operating in Class B mode of the present invention.
Figure 5:
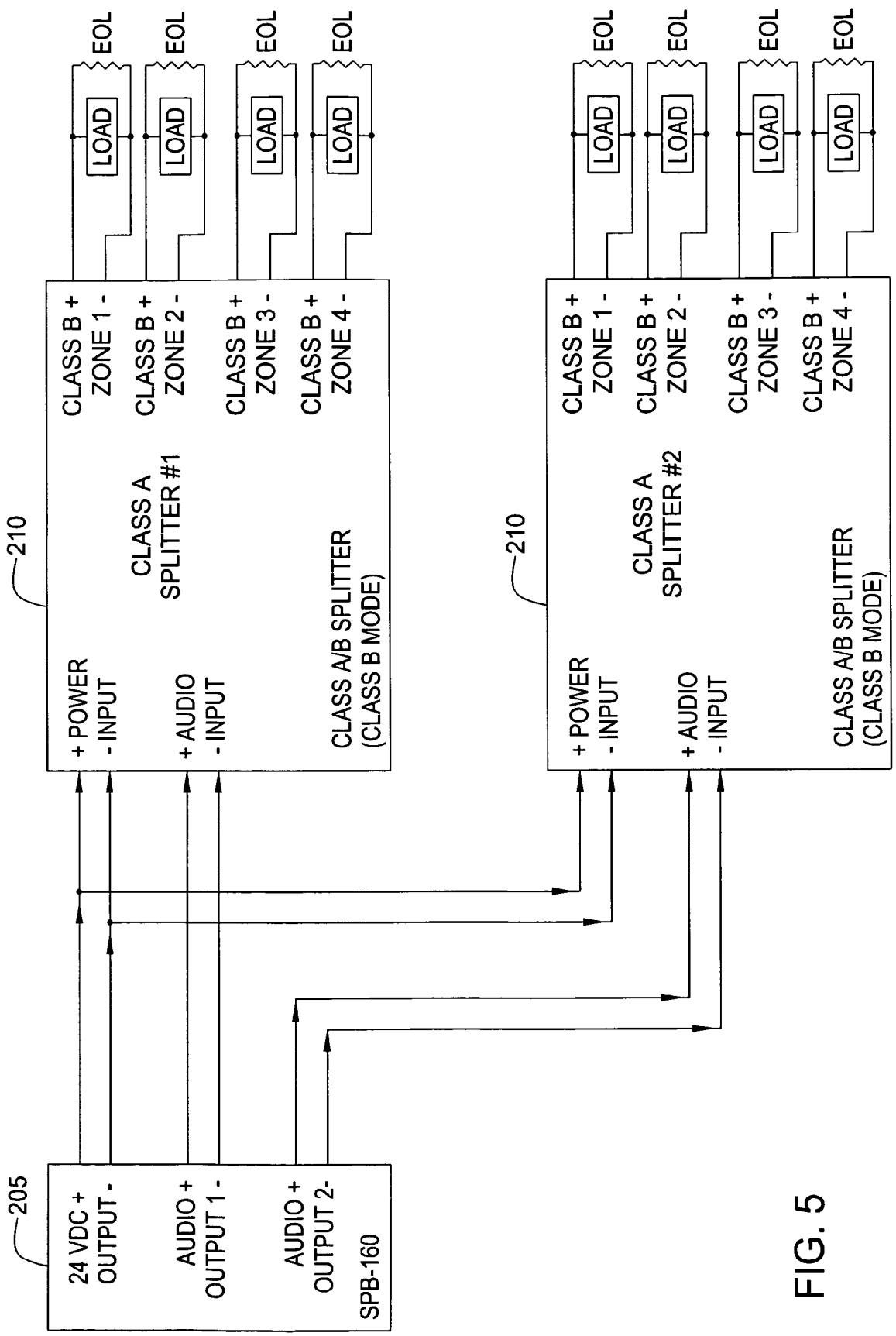
FIG. 5 illustrates a wiring diagram for connecting two splitters of the present invention for Class B.

FIG. 3 illustrates a splitter 210 operating in Class B mode of the present invention. When Class B mode is selected, the splitter 210 only supports Class B wiring. While in Class B mode, the splitter 210 in one embodiment allows for a maximum of four supervised audio output zones. FIG. 5 also illustrates a pair of splitters 210 operating in Class B mode. It should be noted that in one embodiment, an end of line (EOL) resistor, e.g., 10 kOhm is used whether Class A or Class B mode is selected.

The splitter of the present invention has the ability to detect and present trouble conditions. In one embodiment, the Class A/B splitter of the present invention has one green LED to indicate that the power is on. The Class A/B splitter also has nine (9) amber LEDs to indicate trouble conditions. Eight (8) of the amber LEDs are selectively used to indicate a specific trouble condition is detected, whereas the ninth amber LED lights up during any trouble condition. For example, the specific trouble conditions may include "Open," or "Short" where two indicator LEDs are used per Class B Splitter output, or 4 indicator LEDs are used per Class A output. The number of LEDS employed in the splitter is implementation specific and is not a limitation of the present invention.

In one embodiment, the Class A/B splitter derives its power from the 24VDC output on the SP-40, or on the SPB160, or the SPB-80/4. The Class A/B splitter's audio input is derived from audio output of the SP-40, or the SPB-160 (1 circuit) or the SPB-80/4. When using two Class A/B splitters on the SPB-160, one splitter must be connected to one audio output 1, while the other splitter must be connected to audio output 2 (e.g., see FIG. 4 and FIG. 5).

When in Class A mode, the splitter has four outputs: 1) Main output one, 2) Backup output one, 3) Main output two, and 4) Backup output two. The maximum audio output for a splitter in Class A mode is 40 Watts per Class A circuit (e.g., one Main and one Backup audio output make up one Class A circuit.) The Backup audio output can support the entire 40 Watt load incase a break occurs anywhere in the audio output circuit. The EOL resister is only used on the Backup audio outputs.

When in Class B mode, the splitter has four outputs: 1) Zone 1 output, 2) Zone 2 output, 3) Zone 3 output, 4) Zone 4 output. The maximum audio output for a splitter in Class B mode is 20 Watts (per Zone output.) The EOL resister is used on every audio output zone.

Trouble conditions are now briefly described for Class A mode and for Class B mode. Additionally, the splitter's response is also briefly described.

Class A Mode—for Main Audio Output(s):

In one embodiment, DC supervision voltage is measured across a Main Audio output terminal block. An "Open" trouble is detected when the DC supervision voltage goes above 14VDC. A "Minor Short" trouble is detected when the DC supervision voltage goes below 6VDC. A "Major Short" trouble is detected when the DC supervision voltage on an audio output goes below 2VDC.

Class A Mode—for Backup Audio Output(s):

In one embodiment, this voltage is measured across a Backup Audio Output terminal block. An "Open" trouble is detected when the DC super vision voltage goes above 14VDC. A "Minor Short" trouble is detected when the DC supervision voltage goes below 6VDC. A "Major Short" trouble is detected when the DC supervision voltage goes below 2VDC.

Splitter's Response to Trouble Condition(s) on Audio Outputs While in Class A mode.

1) If the "+" Wire Goes Open:

The Main Audio Output circuit will light its "Open" LED, and present a 5 kohm EOL resistance to the SP-40, SPB-160, or SPB-80/4. The Backup Audio Output circuit will light its "Open" LED too. The "General" trouble LED will also light up.

2) If the "−" Wire Goes Open:

The Main Audio Output circuit will light its "Open" LED, and present a 5 kohm EOL resistance to the SP-40, SPB-160 or SPB-80/4. The "General" trouble LED will also light up.

3) If the "+" and "−" Wires Both Go Open:

The Main Audio Output circuit will light its "Open" LED, and present a 5 kohm EOL resistance to the SP-40, SPB-160 or SPB-80/4. The "General" trouble LED will also light up.

4) If a "Minor Short" Occurs:

The Main Audio Output circuit will light its "Short" LED, and present a 5 kohm EOL resistance to the SP-40, SPB-160 or SPB-80/4. The Backup Audio Output circuit will light its "Short" LED too. The "General" trouble LED will also light up.

5) If a "Major Short" Occurs:

The Main Audio Output circuit will light its "Short" LED, and present a 5 kohm EOL resistance to the SP-40, SPB-160 or SPB-80/4. The Main Audio Output circuit will disconnect its audio path to the load. The Backup Audio Output circuit will light its "Short" LED and disconnect its audio path to the load. The "General" trouble LED will also light up.

Class B Mode—for all Audio Output(s):

In one embodiment, DC supervision voltage is measured across an audio output zone terminal block. An "Open" trouble is detected when the DC supervision voltage goes above 14VDC. A "Minor Short" trouble is detected when the DC supervision voltage goes below 6VDC. A "Major Short" trouble is detected when the DC supervision voltage on an audio output goes below 2VDC.

Class A/B Splitter's Response to Trouble Condition(s) on Audio Outputs While in Class B Mode.

1) If an Audio Output Zone's "+" Wire Goes Open:

That audio output zone will light its "Open" LED, and present a 5 kohm EOL resistance to the SP-40, SPB-160, or SPB-80/4. The "General" trouble LED will also light up.

2) If an Audio Output Zone's "−" Wire Goes Open:

That audio output zone will light its "Open" LED, and present a 5 kohm EOL resistance to the SP-40, SPB-160 or SPB-80/4. The "General" trouble LED will also light up.

3) If an Audio Output Zone's "+" and "−" Wires Both Go Open:

That audio output zone will light its "Open" LED, and present a 5 kohm EOL resistance to the SP-40, SPB-160 or SPB-80/4. The "General" trouble LED will also light up.

4) If an Audio Output Zone has a "Minor Short":

That audio output zone will light its "Short" LED, and present a 5 kohm EOL resistance to the SP-40, SPB-160 or SPB-80/4. The "General" trouble LED will also light up.

5) If an Audio Output Zone has a "Major Short":

That audio output zone will light its "Short" LED, and present a 5 kohm EOL resistance to the SP-40, SPB-160 or SPB-80/4. That audio output zone will disconnect its audio path to the load. The "General" trouble LED will also light up.

Figure 6:
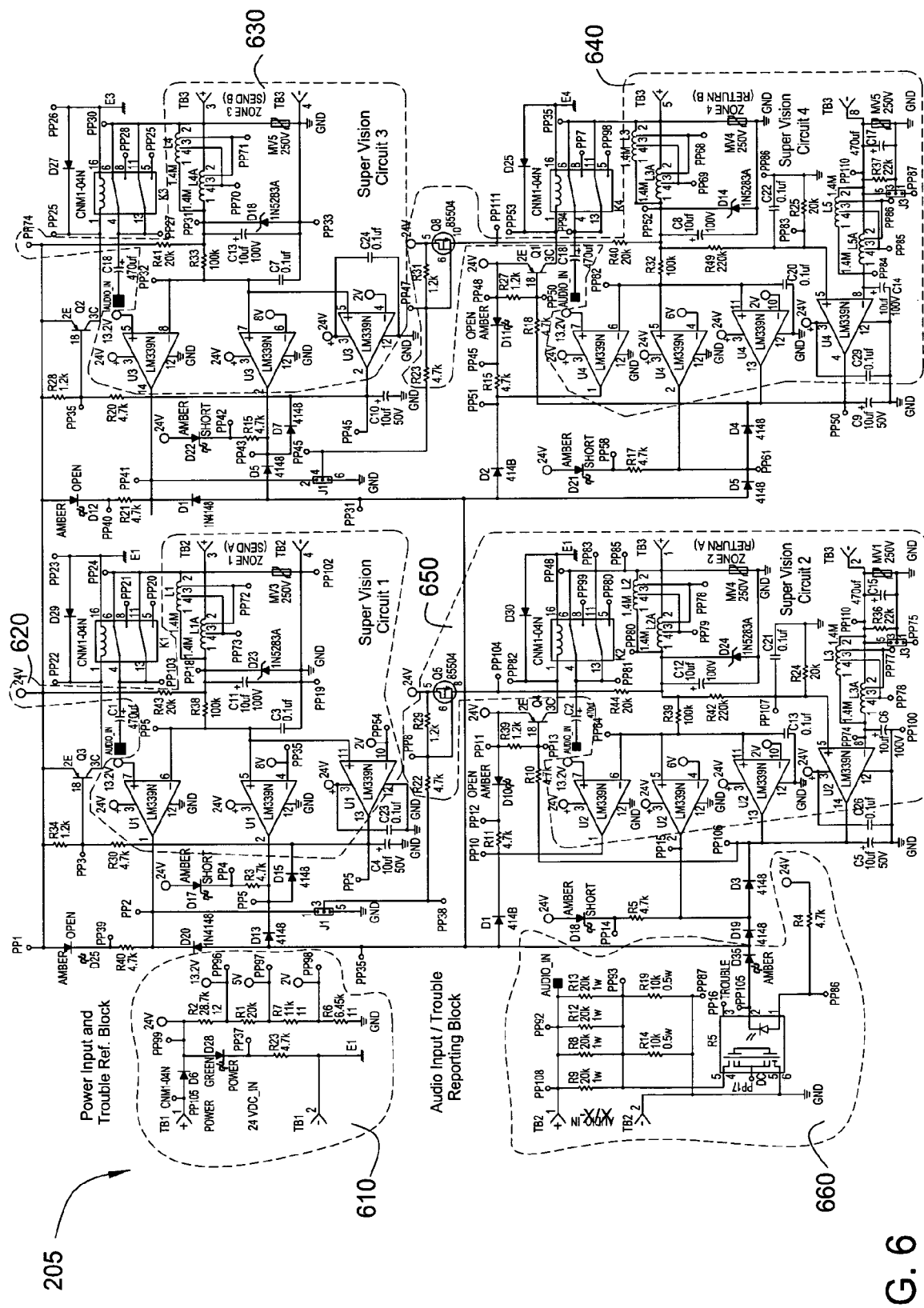
FIG. 6 illustrates a detailed schematic diagram of a splitter of the present invention.
Figure 7A:
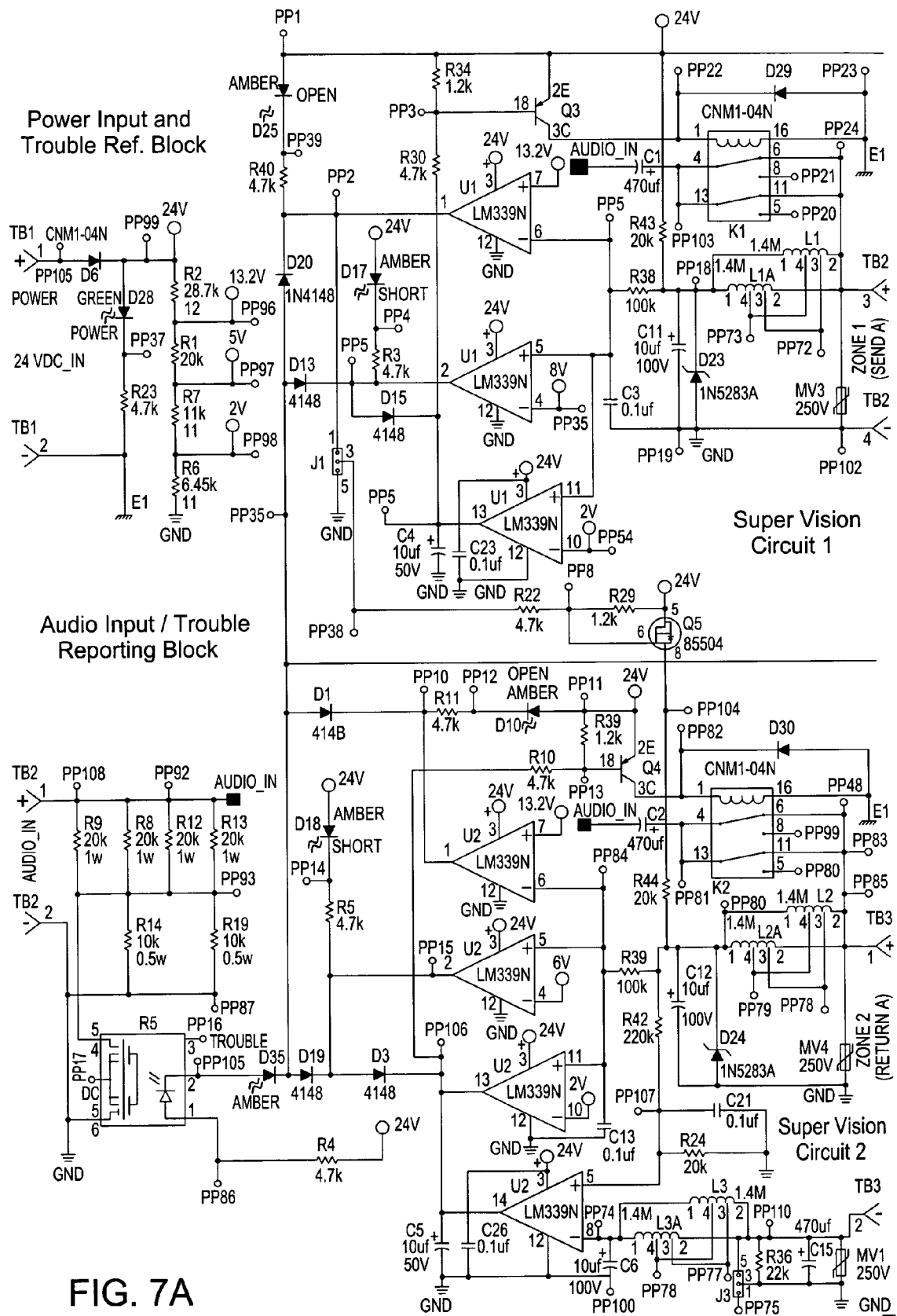
FIGS. 7A and 7B are magnified views of FIG. 6.
Figure 7B:
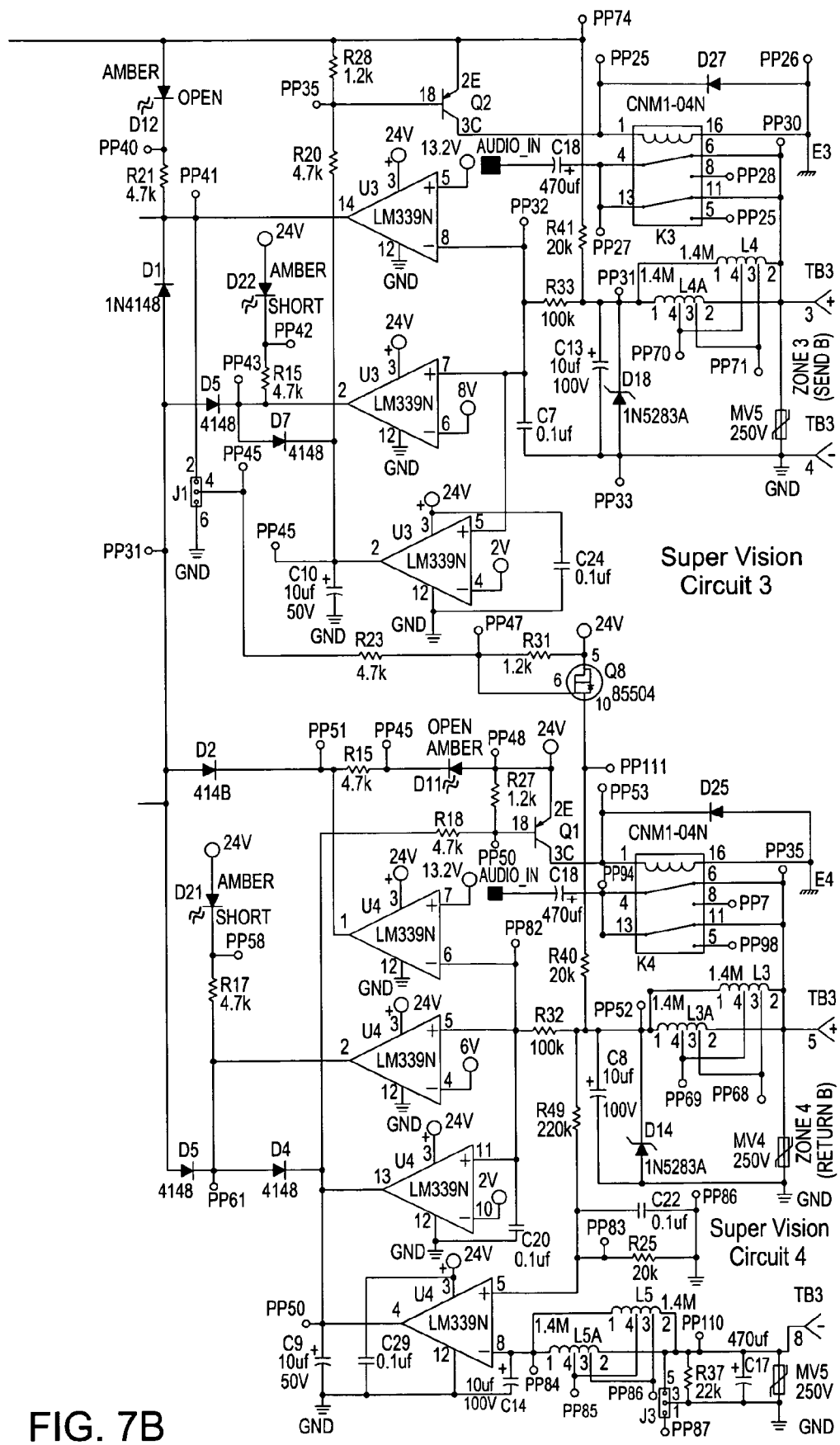

FIG. 6 illustrates a detailed schematic diagram of a splitter 205 in one embodiment of the present invention. The CLASS A/B splitter 205 comprises a plurality of major blocks, e.g., six (6) basic blocks as illustrates in FIG. 6: These blocks are organized to illustrate the present invention are not intended to limit the present invention. Those skilled in the art will realize that these blocks can be organized or implemented in different configurations. Given the size of FIG. 6, FIGS. 7A and 7B are magnified views of FIG. 6.

1) Power Input & Trouble Reference Block (610)

This Block is the source of power and trouble condition references for each of the Supervision Circuits for both CLASS A mode and CLASS B mode.

2) Audio Input/Trouble Reporting Block (660)

This Block is the source of Audio for each of the Supervision Circuits and the place where trouble conditions get reported to either the SP-40/2, SPB-80/4 or the SPB0160 audio amplifiers for both CLASS A mode and CLASS B mode.

3) Supervision Circuit 1 (620)

This Block passes Audio and supervises the field wiring to speakers. When the CLASS A/B splitter is set for CLASS B mode, this is Zone Output 1. When the CLASS A/B splitter is set for CLASS A mode, this is SEND ZONE A.

4) Supervision Circuit 2 (650)

This Block passes Audio and supervises the field wiring to speakers. When the CLASS A/B splitter is set for CLASS B mode, this is Zone Output 2. When the CLASS A/B splitter is set for CLASS A mode, this is RETURN ZONE A.

5) Supervision Circuit 3 (630)

This Block passes Audio and supervises the field wiring to speakers. When the CLASS A/B splitter is set for CLASS B mode, this is Zone Output 3. When the CLASS A/B splitter is set for CLASS A mode, this is SEND ZONE B.

6) Supervision Circuit 4 (540)

This Block passes Audio and supervises the field wiring to speakers. When the CLASS A/B splitter is set for CLASS B mode, this is Zone Output 4. When the CLASS A/B splitter is set for CLASS A mode, this is RETURN ZONE B.

Figure 8:
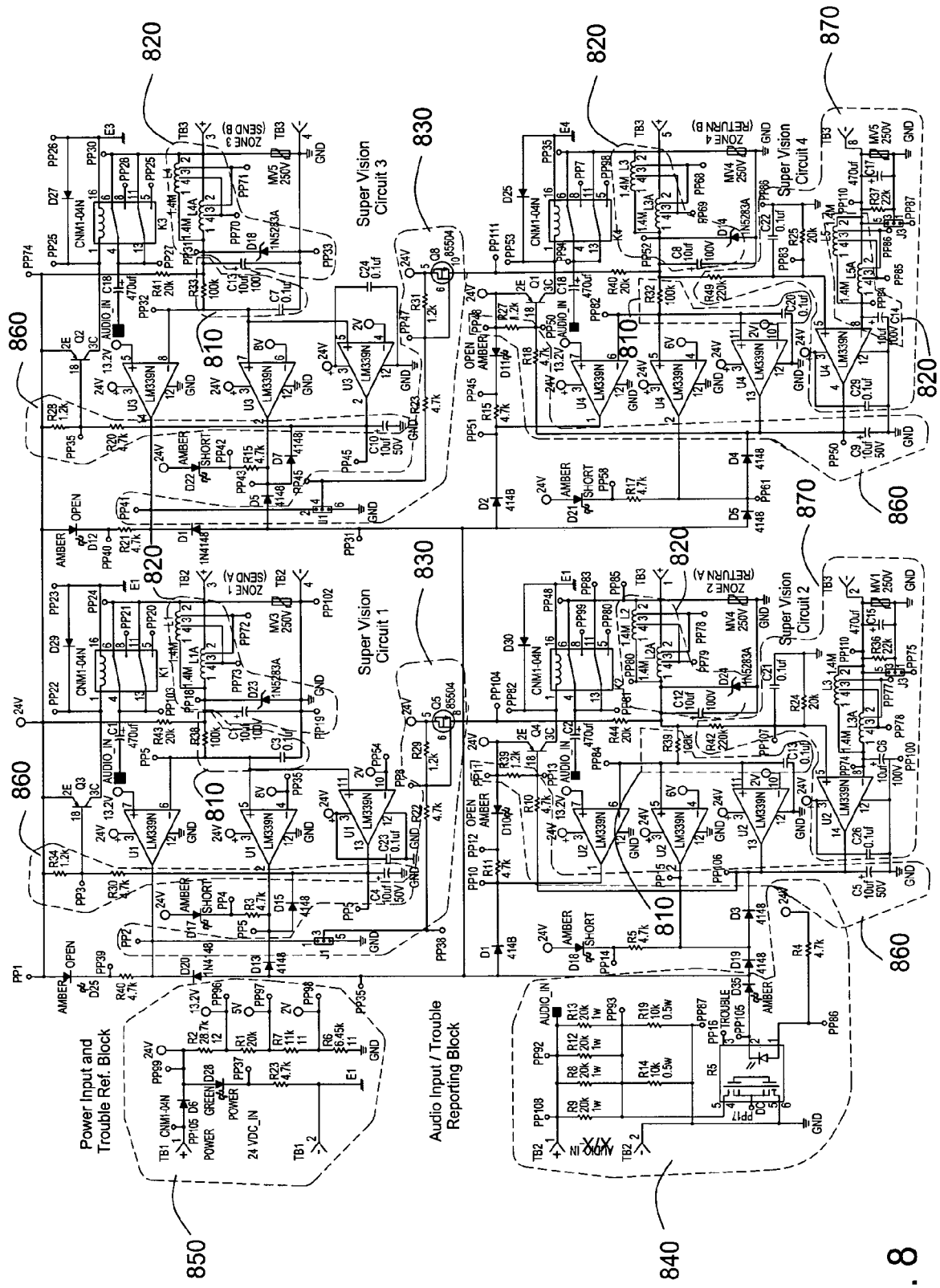
FIG. 8 illustrates a detailed schematic diagram of FIG. 6 with grouping of components based on functions.

The functions of FIG. 6 are now described with reference to FIG. 8. It should be noted that FIG. 6 and FIG. 8 illustrate the same schematic diagram, but FIG. 8 is used to show grouping of components that are responsible for various functions. It should be noted that the grouping of components in FIG. 8 is performed "broadly" based on functions. In other words, the grouping is simply performed to assist the reader in understanding the present invention, but it is not intended to definitively define each and every components that are involved in performing each function. Those skilled in the art will realize that various components may perform more than one function or are so scattered on the schematic diagram that it is impractical to identify each and every components. It should be noted that portions of FIG. 8 contain reference numeral to assist the reader. In some instances, a grouping may contain a plurality of sections scattered across the schematic diagram.

Fast Shut Off Block/Noise Filter (810)

The present splitter has a fast shut off circuit. Specifically, each of the 4 output zones has a "Fast Shut Off" circuit used to quickly discharge the stored energy in 0.1 uF capacitors. The 100 kohm and 0.1 uF charge/discharge time constants (0.01 s) allow the CLASS A/B splitter to disable the audio on a "Major Shorted" zone faster than the SP-40/2, SPB-80/4 and the SPB-160, preventing those devices from going into "Power Limiting," as defined by UL 864.

In one embodiment, the time constant of (0.01 s) is sufficient to prevent line noise (defined as sudden transient and momentary drops in supervision voltage) from causing the "Major Short" supervision circuit to prematurely disable audio.

Audio Filter Block (820)

In one embodiment, each of the 4 output zones has an "Audio Filter" block consisting of an inductor and a capacitor used to prevent audio from entering the supervision circuits causing a false reading. The DC supervision voltage passes through the filter. The components L1 and C11, L2 and C12, L3* and C6*, L4 and C13, L5 and C8, L6* and C14* act as $2^{nd}$ Order Low Pass filters whose resonant frequency, $\omega=1/(2\pi\sqrt{(LC)})=42.56$ Hz. All frequencies above 42.56 Hz are rolled off (reduced) by 12 dB/Octave.

Return Zone Supervision Enable Block (830)

In one embodiment, under normal operating conditions (No Troubles,) MOSFET Q5 and A6 are OFF, so the only source for Supervision Voltage is from the SENDZONE. Once a SENDZONE detects an "Open," that zone's comparator (with the 13.2V reference) will output a "LOW," providing a virtual ground to its respective RETURN ZONE's MOSFET, turning it on. This enables the Return's Zone's Supervision Voltage allowing it to detect additional output Trouble Conditions.

Trouble Reporting/Audio Input Block (840)

In one embodiment, under normal operating conditions, both K5 and the "Trouble LED" are off. The CLASS A/B splitter's Input Resistance is 10 kohms. When any Trouble occurs, the appropriate comparators will output a "LOW," providing a virtual ground for that comparator's associated Trouble LED, the "General Trouble LED," and K5. The virtual ground turns all of these components ON. When K5 is ON, it shorts out R14 and R15 giving a 5 kohm Input Resistance. The SP-40/2, SPB-80/4 or SPB-160 driving the CLASS A/B splitter will detect this 5 kohms as a "Short" and go into "Trouble."

TB2 is the Trouble Reporting and the Audio path. This allows the CLASS A/B splitter to report trouble while Passing Audio over the 2 wires.

Power Input & Trouble Reference Block (850)

In one embodiment, this block represents where power (24VDC) enters the CLASS A/B splitter to provide power for the comparators, their Trouble Reference voltages and the source of Supervision Voltage itself. The Trouble Reference voltages are derived from a resistor divider network to provide 13.2V, 6V and 2V references. The resistor divider network consists of R2 (28.7 kohms,) R1 (20 kohms,) R7 (11 kohms,) R6 (6.49 kohms.) If the Supervision Voltage goes above 13.2V, an Open will be detected. If the Supervision Voltage goes below 6V, a Minor Short will be detected. If the Supervision Voltage goes below 2V, a Major Short will be detected.

Relay Delay Block (860)

In one embodiment, this block consists of a 1.2 kohm resistor (either R34; R35; R28; R27,) a 4.7 kohm resistor (either R30; R10; R20; R18) and a 10 uF capacitor (either C4; C5; C10; C9.) There is one Relay Delay block per zone. The purpose of this zone is to act as a "Fast OFF, Slow ON" delay for the audio output relays. That is, when a Major Short is detected on an Output Zone, that zone's Major Short comparator (the one with a 2V reference) will output a "LOW" which provides a virtual ground that will quickly discharge its respective 10 uF capacitor and allow its respective transistor (either Q3; Q4; Q2; Q1) to turn ON and disable audio to that zone. When the Major Short is removed from the Output Zone and the supervision voltage rises above 2V, that Output Zone's Major Short comparator will output a "HIGH," and its respective 10 uF capacitor will charge up through 5.9 kohms (4.7 kohms+1.2 kohms.) The 5.9 kohms delays the transistor from turning on too fast. Turning on too fast would cause "relay chatter," prematurely wearing out the relay and making lots of rapid "clicking" or "buzzing" noises.

+Open, −Open, Major Short Block (870)

In one embodiment, this block is only enabled in CLASS A mode. Its purpose is to detect and react to one specific Trouble Condition: When the Output+ AND the Output− wires are Open AND a Major Short occurs on the RETURN ZONE, this block disables audio out of the RETURN ZONE, allowing audio to continue to play out of the SEND ZONE.

This block consists of a voltage divider (220 kohm [R42, R45] and 680 kohm [R24, R26] resistors,) an Audio Filter Block (1.4H inductor, 10 uF capacitor,) an audio pass through Capacitor (470 uF [C15, C17,]) the 10 kohm End Of Line resistor, a 22 kohm [R36, R37] resistor and an additional comparator.

Block Operation: When the Output+ and Output− wires are Open, the Supervision Voltage will rise above the 13.2V threshold. The SEND ZONE Comparator with the 13.2V reference will output a "LOW," providing a virtual ground for its "Open Trouble" reporting circuit and for the RETURN ZONE Supervision Enable Block. Once the R.Z.S.E.B. Block is enabled, the RETURN ZONE now provides its own DC Supervision Voltage. Compare FIG. 1 (Normal Operation) to FIG. 4 (Output+ and Output− Open) to see how this is done. The RETURN ZONE now has its own Supervision Voltage on both Output+ and Output− wires divided across the 10 kohm End Of Line resistor.

With the 220 kohm and 680 kohm (1:3) voltage divider and the (1:2) divider created by the 10 kohm End Of Line and 22 kohm resistors, the additional comparator can detect a Major Short.

1) With Output+ and Output− Open on the RETURN ZONE, the additional comparator sees ⅔ of the Supervision Voltage on its "+" pin and ½ of the Supervision Voltage on its "−" pin. Thus the comparator outputs a "HIGH."

2) With Output+ and Output− Open and a Major Short on the RETURN ZONE, the additional comparator sees ⅔ of the Supervision Voltage on its "+" pin and the full Supervision Voltage on its "−" pin. Thus the comparator outputs a "LOW," providing a virtual ground for the Major Short trouble reporting circuit.

Various ranges and specifications of operating and trouble conditions are provided below. It should be noted that these ranges and specifications are only provided as examples.

For CLASS A Operation:
Trouble Reporting Open Circuit Resistance 26.09 kohm+/−10%
  Normal E.O.L. Resistance 10 kohm+/−5%
  Minor Short Resistance 7.639 kohm+/−10%
  Major Short Resistance 1.1 kohm+/−10%
For CLASS B Operation:
Trouble Reporting Open Circuit Resistance 25.736 kohm+/−10%
  Normal E.O.L. Resistance 10 kohm+/−5%
  Minor Short Resistance 6.213 kohm+/−10%
  Major Short Resistance 1.156 kohm+/−10%

Figure 9:
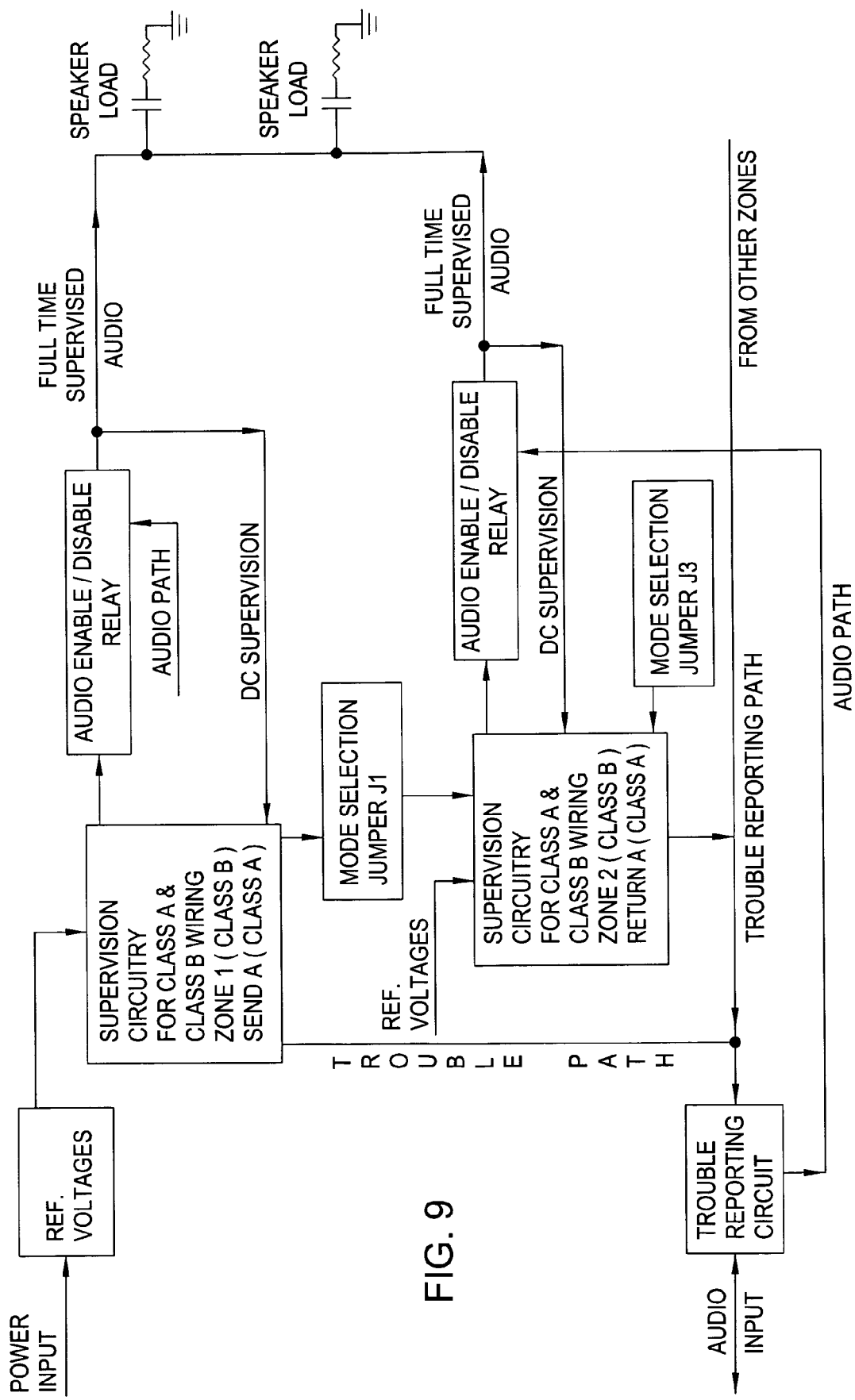
FIG. 9 illustrates the present splitter in a block diagram.

FIG. 9 illustrates the splitter 205 of the present invention in a block diagram. In one embodiment, an Open Circuit is caused by either of the Audio Output wires, or both, being disconnected, or by the End of Line resistor being disconnected. Audio is still enabled while either an "Output +" Open, "Output−" Open, or "Outputs + and −" are Open.

In one embodiment, Minor Shorts are caused by either SP-80/4's or SPB-160's that are attached to a CLASS A/B splitter output and are in TROUBLE. Audio is still enabled while a Minor Short is detected.

In one embodiment, Major Shorts are caused by the CLASS A/B splitter Output+ and Output− wires coming into contact with one another. When this occurs, audio goes across the short and right to ground, skipping all the speakers and overloading the SP-40/2, SP-80/4 or SPB-160. When a Major Short occurs, DC Supervision voltage flows right to ground, dropping the Supervision Voltage to near 0 volts DC.

In one embodiment, while supervising the audio outputs, if the CLASS A/B splitter detects a "MAJOR SHORT" in either CLASS A or CLASS B mode, it will disconnect the affected audio output(s) before the MAJOR SHORT causes the SP-40/2, SP-80/4 or the SPB-160 to trip their "POWER LIMITING" circuits. POWER LIMITING circuits, once initiated, disable the SP-40/2, SP-80/4 or SPB-160's audio amplifier until their power and batteries are turned off, then back on (as per UL 864.) The block responsible for this is the FAST SHUT OFF/NOISE FILTER block.

In one embodiment, while in CLASS A mode, if an Output+ Open Trouble Condition is detected, the SEND ZONE will enable the RETURN ZONE's Supervision Voltage source. This allows the RETURN ZONE to supervise its output for any additional troubles.

a) When an Output+ Open occurs, the RETURN ZONE's Supervision Voltage goes across a 20 kohm resistor (R44, or R40,) the 10 kohm End Of Line resistor and follows the path to the SEND ZONE's ground. See FIG. 2 for more information.

b) When an Output− Open occurs, the RETURN ZONE's Supervision Voltage goes across a 20 kohm resistor (R44, or R40) in parallel with the SEND ZONE's 20 kohm resistor (R43, or R41,) the 10 kohm End Of Line resistor, the 22 kohm resistor (R42, or R37,) and follows the path to the RETURN ZONE's ground. See FIG. 3 for more information.

c) When an Output− and Output+ Open occurs, the RETURN ZONE's Supervision Voltage goes across a 20 kohm resistor (R44, or R40,) the 10 kohm End Of Line resistor, the 22 kohm resistor (R42, or R37,) and follows the path to the RETURN ZONE's ground. See FIG. 4 for more information.

It should be noted that the present invention can be implemented in software and/or in a combination of software and hardware, e.g., using application specific integrated circuits (ASIC), a general purpose computer or any other hardware equivalents. In one embodiment, the present splitter can be loaded into a memory and executed by a processor or controller to implement the functions as discussed above. As such, the present splitter (including associated data structures) of the present invention can be stored on a computer readable medium or carrier, e.g., RAM memory, magnetic or optical drive or diskette and the like.

Although various embodiments which incorporate the teachings of the present invention have been shown and described in detail herein, those skilled in the art can readily devise many other varied embodiments that still incorporate these teachings.

What is claimed is:

1. A method for converting a single input audio signal into a plurality of audio outputs, the method using a processor to perform steps comprising:

receiving the single input audio signal at a single audio signal splitter;

selectively switching between a plurality of classes of wiring modes at the single audio signal splitter during operation of the single audio signal splitter based on a selection by a user of one of the plurality of classes of wiring modes using a switching mechanism in the single audio signal splitter, such that the single audio signal splitter supports all of the plurality of classes of wiring modes in a single device;

determining a maximum number of audio output zones for the one of the plurality of classes of wiring modes; and converting the single input audio signal into the plurality of audio outputs that supports the one of the plurality of classes of wiring modes, wherein the plurality of audio outputs comprises a number of audio output zones that is less than or equal to the maximum number.

2. The method of claim 1, wherein said plurality of classes of wiring modes comprises a Class A wiring mode and a Class B wiring mode.

3. The method of claim 1, wherein said single input audio signal is a supervised audio signal and said plurality of audio outputs is a plurality of supervised audio outputs.

4. The method of claim 3, wherein said single input audio signal is received from an emergency voice evacuation system or a supervised audio power booster.

5. The method of claim 3, further comprising:
detecting at least one trouble condition on at least one of said plurality of supervised audio outputs.

6. The method of claim 5, wherein said at least one trouble condition comprises at least one of an open or a short.

7. The method of claim 1, wherein the switching mechanism is manually operable by the user.

8. The method of claim 1, wherein the maximum number varies among the plurality of classes of wiring modes.

9. The method of claim 8, wherein the maximum number is two when the one of the plurality of classes of wiring modes is Class A wiring mode.

10. The method of claim 8, wherein the maximum number is four when the one of the plurality of classes of wiring modes is Class B wiring mode.

11. An apparatus for converting a single input audio signal into a plurality of audio outputs, comprising:
means for receiving the single input audio signal at the apparatus;
switching means in the apparatus for selectively switching between a plurality of classes of wiring modes at the apparatus during operation of the apparatus based on a selection by a user of one of the plurality of classes of wiring modes
means for determining a maximum number of audio output zones for the one of the plurality of classes of wiring modes; and
means for converting the single input audio signal into the plurality of audio outputs that supports the one of the plurality of classes of wiring modes, wherein the plurality of audio outputs comprises a number of audio output zones that is less than or equal to the maximum number,
wherein said apparatus comprises a single audio signal splitter that supports all of the plurality of classes of wiring modes in a single apparatus.

12. The apparatus of claim 11, wherein said plurality of classes of wiring modes comprises a Class A wiring mode and a Class B wiring mode.

13. The apparatus of claim 11, wherein said single input audio signal is a supervised audio signal and said plurality of audio outputs is a plurality of supervised audio outputs.

14. The apparatus of claim 13, wherein said single input audio signal is received from an emergency voice evacuation system or a supervised audio power booster.

15. The apparatus of claim 11, further comprising:
means for detecting at least one trouble condition on at least one of said plurality of supervised audio outputs.

16. The apparatus of claim 15, wherein said at least one trouble condition comprises at least one of an open or a short.

17. A non-transitory computer-readable medium having stored thereon a plurality of instructions, the plurality of instructions including instructions which, when executed by a processor, cause the processor to perform steps of a method for converting a single input audio signal into a plurality of audio outputs, comprising:
receiving the single input audio signal at a single audio signal splitter;
selectively switching between a plurality of classes of wiring modes at the single audio signal splitter during operation of the single audio signal splitter based on a selection by a user of one of the plurality of classes of wiring modes using a switching mechanism in the single audio signal splitter, such that the single audio signal splitter supports all of the plurality of classes of wiring modes in a single device;
determining a maximum number of audio output zones for the one of the plurality of classes of wiring modes; and
converting the single input audio signal into the plurality of audio outputs that supports the one of the plurality of classes of wiring modes, wherein the plurality of audio outputs comprises a number of audio output zones that is less than or equal to the maximum number.

18. The non-transitory computer-readable medium of claim 17, wherein said plurality of classes of wiring modes comprises a Class A wiring mode and a Class B wiring mode.

19. The non-transitory computer-readable medium of claim 17, wherein said single input audio signal is a supervised audio signal and said plurality of audio outputs is a plurality of supervised audio outputs.

20. The non-transitory computer-readable medium of claim 19, wherein said single input audio signal is received from an emergency voice evacuation system or a supervised audio power booster.

21. The non-transitory computer-readable medium of claim 19, further comprising:
detecting at least one trouble condition on at least one of said plurality of supervised audio outputs.

22. The non-transitory computer-readable medium of claim 21, wherein said at least one trouble condition comprises at least one of an open or a short.

* * * * *